United States Patent
Zhang et al.

(10) Patent No.: US 7,554,409 B1
(45) Date of Patent: Jun. 30, 2009

(54) OVER-CURRENT PROTECTION CIRCUIT AND METHOD FOR PROTECTING SWITCHING POWER AMPLIFIER CIRCUITS

(75) Inventors: Lingli Zhang, Austin, TX (US); Johann Gaboriau, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 84 days.

(21) Appl. No.: 11/862,481

(22) Filed: Sep. 27, 2007

(51) Int. Cl.
*H03F 1/52* (2006.01)

(52) U.S. Cl. .......................... 330/298; 330/10; 330/251

(58) Field of Classification Search .................... 330/10, 330/207 P, 251, 298, 307; 381/94.5, 94.8, 381/120
See application file for complete search history.

(56) References Cited

U.S. PATENT DOCUMENTS

| | | | |
|---|---|---|---|
| 4,322,770 | A | 3/1982 | Sendelweck |
| 5,126,637 | A | 6/1992 | Watts et al. |
| 6,107,844 | A | 8/2000 | Berg et al. |
| 6,639,815 | B1 | 10/2003 | Guycyski |
| 6,737,713 | B2 | 5/2004 | Georgescu et al. |
| 7,268,621 | B2 * | 9/2007 | Kanoh et al. ............. 330/207 P |
| 2004/0184627 | A1 * | 9/2004 | Kost et al. ................... 330/251 |
| 2008/0043391 | A1 | 2/2008 | Wong et al. |

OTHER PUBLICATIONS

TA5132 Datasheet, Texas Instruments, 2006.
LM 4673 Datasheet, National Semiconductor, Apr. 2006.

* cited by examiner

*Primary Examiner*—Khanh V Nguyen
(74) *Attorney, Agent, or Firm*—Andrew M. Harris; Mitch Harris, Atty at Law, LLC

(57) ABSTRACT

An over-current protection circuit protection circuit and method for protecting switching power amplifier circuits provides protection against latch-up and other failures due to energy returned from an inductive load when one or more transistors in the amplifier output are disabled in response to an over-current condition. Upon detection of an over-current condition, the transistor corresponding to the over-current conduction direction is disabled. At the same time, the transistor corresponding to the conduction direction opposite the over-current direction is enabled for a predetermined time period, or until the magnitude of the load current has dropped, so that energy stored in inductance of the load is reduced, preventing back-currents that would otherwise cause latch-up and consequent destruction of the output stage when the switching power output stage is disabled. After the predetermined time period has elapsed or the load current has dropped below a threshold, the entire output stage is disabled.

25 Claims, 6 Drawing Sheets

OVER-CURRENT PROTECTION CIRCUIT AND METHOD FOR PROTECTING SWITCHING POWER AMPLIFIER CIRCUITS

CROSS-REFERENCE TO RELATED PATENT APPLICATIONS

The present U.S. Patent Application is related to U.S. patent application Ser. No. 11/862,324 entitled "PROTECTION CIRCUIT AND METHOD FOR PROTECTING SWITCHING POWER AMPLIFIER CIRCUITS DURING RESET", filed concurrently herewith, and to U.S. patent application Ser. No. 11/862,338 entitled "THERMAL OVERLOAD PROTECTION CIRCUIT AND METHOD FOR PROTECTING SWITCHING POWER AMPLIFIER CIRCUITS" also filed concurrently herewith. Both of the above-referenced U.S. Patent Applications are incorporated herein by reference, have at least one common inventor, and are assigned to the same Assignee.

BACKGROUND OF THE INVENTION

1. Field of the Invention

The present invention relates generally to integrated circuit switching power amplifiers, and more specifically, to a circuit and method for protecting against latch-up failures when a switching power amplifier output stage is disabled in response to detection of an over-current condition.

2. Background of the Invention

Switching power amplifiers are currently in widespread use in automotive amplifiers and other audio amplifiers. Such amplifiers, sometimes referred to as Class D amplifiers, have higher efficiency than linear amplifiers, making them well suited for battery driven applications and applications where power dissipation in the form of heat is a problem, such as very high power professional audio applications, as in concert halls.

The outputs of switching power amplifiers are typically provided to an inductive load, which typically includes a filter inductor through which the output(s) is series-connected to a filter capacitor that is connected in parallel with the load, which may also be highly inductive, such as a loudspeaker. When an over-current condition occurs in the amplifier circuits, the control logic that provides the switching power drive to the output typically turns off the drive transistors that switch power to the output terminal(s). However, since the load (including output filtering components) is typically inductive, energy is stored in the inductance of the load and a back-current will occur when the drive transistors are turned off.

When the output driver transistors are integrated on a common substrate, the back-current injects minority carriers through a junction between the output terminal of one of the transistors and the adjoining substrate or well. For example, in a P-type substrate integrated circuit, a current drawn from the output terminal will cause minority carrier injection into the substrate through the drain terminal of the N-channel device that is connected to the output terminal if the potential of the output is sufficiently below the substrate potential so that the PN junction between the substrate and the drain terminal of the N-channel device turns on. Simultaneously, the substrate may have other PN junctions with N-type diffusions of other devices integrated on the substrate, which effectively form bipolar transistors having a collector at each N-type diffusion on the substrate, the substrate as a base, and the drain terminal of the N-channel output device as an emitter. Therefore, minority carrier injection into the substrate is undesirable in that other devices may be turned on or disrupt the operation of another circuit, for example, changing the state of a stored logical value. In the power output stage, the minority carriers in one device can cause a control change in the complementary device that through feedback turns both parasitic devices on, causing latch-up and failure of the integrated circuit. Alternatively or at the same time, when the injected current is much larger (on the order of $10^3$ or $10^6$) than the nominal current of another high current gain device forming a complementary parasitic transistor with the substrate, then the complementary parasitic transistor can provide an over-current path to cause latch-up and failure of the integrated circuit.

Similarly, a current injected into the output terminal will cause minority carrier injection into the N-well that isolates the drain and source of the P-channel device from the substrate, if the potential of the output terminal is sufficiently above the N-well potential so that the PN junction between the N-well and the drain terminal of the P-channel device turns on. Additionally, the N-well has a PN junction with the substrate, which effectively forms bipolar transistors having collectors at the substrate and each P-type diffusion within the substrate, the N-well as a base, and the drain terminal of the P-channel output device as an emitter. Therefore, minority carrier injection into the N-well is undesirable in that other devices may be turned on, or disrupt the operation of another circuit. In the power output stage, the minority carriers in one device can cause a control change in the complementary device that through feedback turns both parasitic devices on, causing latch-up and failure of the integrated circuit. Alternatively or at the same time, when the injected current is much larger (on the order of $10^3$ or $10^6$) than the nominal current of another high current gain device forming a complementary parasitic transistor with the substrate, then the complementary parasitic transistor can provide an over-current path to cause latch-up and failure of the integrated circuit.

Therefore, when driving an inductive load, techniques such as floating substrates and guard rings as described in: "Substrate Connection in an Integrated Power Circuit", U.S. Pat. No. 6,737,713, to Georgescu, et al., have been employed to protect against latch-up and disruption or failure of other components such as digital logic that provides control of the switching output stages, which can potentially cause other devices in the integrated circuit to latch-up. However, if there is sufficient energy stored in the inductive load, the protection of the guard rings can be overcome. Even in applications in which power switching transistors are provided external to a switching power amplifier integrated circuit, if the transistors are fabricated as a monolithic element on a common substrate, latch-up can occur in the switching output stage. Further, such guard rings are applicable only in applications in which the power devices are integrated on the same substrate with the guard rings, and therefore will not provide protection for circuits having separate monolithic driver devices, unless the guard rings are integrated in the driver device package itself.

Therefore, it would be desirable to provide a method and apparatus for protecting a switching amplifier integrated circuit from latch-up and failure due to shutdown of the amplifier in response to detection of an over-current condition. It would further be desirable to provide an amplifier integrated circuit that is protected during over-current shutdown for both internally-integrated power switching device applications and when external power switching transistors are employed.

SUMMARY OF THE INVENTION

The above stated objective of protecting a switching power amplifier during shutdown in response to an over-current condition is achieved in a switching power amplifier integrated circuit and method of operation.

The switching power amplifier integrated circuit includes a control circuit that has a timer. When an over-current condition is detected, the transistor(s) having a conduction direction corresponding to the over-current direction is disabled, and a timer is activated. Until the timer expires, the circuit controlling the switching power stage of the amplifier turns on the transistor(s) having a conduction direction opposite the over-current direction, thereby reducing the stored energy in the inductance of a load coupled to the switching power output stage, which may include both filter inductance and any load inductance. After the timer has expired, the switching power stage is completely disabled. Alternatively, the magnitude of the current flowing through the inductive load may be detected, and the transistor(s) having a conduction direction opposite the over-current direction is enabled until the load current magnitude has fallen below a predetermined threshold.

The switching power stage may be internal to or external to the integrated circuit, with driver outputs of the integrated circuit connected to the switching power stage. The over-current indication may be provided from an internal over-current detection circuit or an externally provided over-current signal.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a circuit and method of operation that discharges stored inductive energy from filter inductors and load inductances coupled to the output of a switching power amplifier prior to disabling the switching power stage in response to detection of an over-current condition. The circuit and method thereby prevent latch-up and consequent circuit failure that can be caused by discharge of stored magnetic energy from the inductances into the disabled power stage transistors. The discharging is performed by turning off the transistor(s) of the output stage that conduct current in a direction corresponding to the over-current, and turning on the transistor(s) that have a conduction direction opposing the over-current direction.

The above-described action immediately interrupts the over-current source, while temporarily maintaining a conduction path for the magnetic energy stored in the load to discharge before the switching power amplifier output stage is completely disabled in response to the over-current condition, preventing latch-up that can destroy the transistors in the output stage or other devices in the integrated circuit. The invention further prevents disruption of operation, including latch-up, of control circuits in the integrated circuit by reducing the amount of stored energy in the inductor at the time the output stage is disabled. Therefore, the invention is also applicable to integrated circuits that provide drive levels to switching power devices external to the integrated circuits.

Figure 1A:
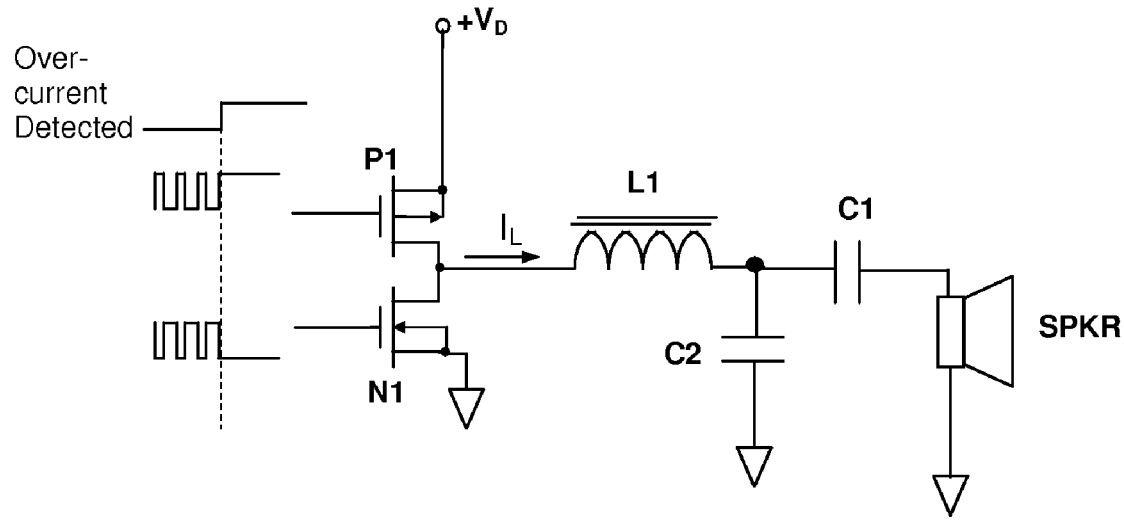
FIG. 1A is a schematic diagram depicting a prior art switching amplifier output stage.
Figure 1B:
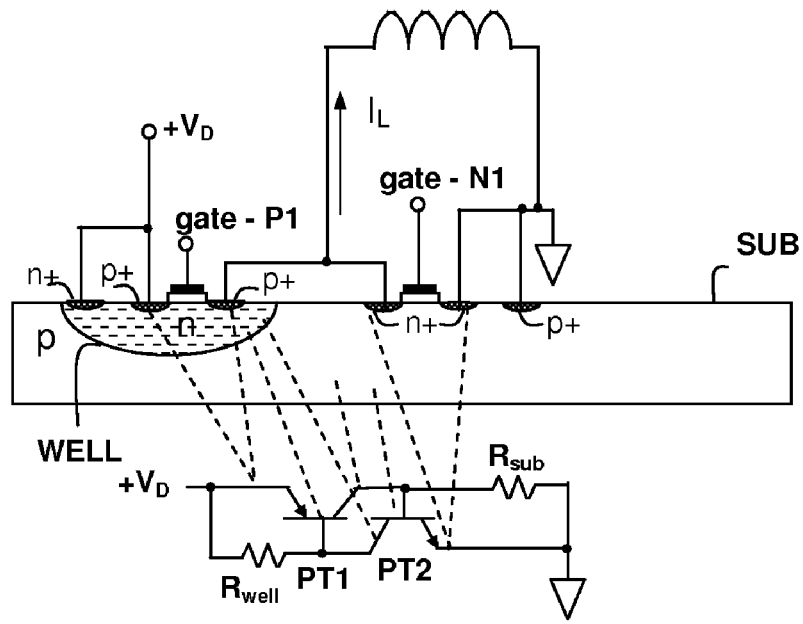
FIG. 1B is a pictorial diagram depicting latch-up mechanism in the prior art switching amplifier output stage of FIG. 1A.

Referring now to the figures, and in particular to FIG. 1A, a prior art CMOS switching amplifier power output stage is shown in the form of a single-ended half-bridge output formed by transistors N1 and P1 that provides a switching pulse-width modulated output signal to an exemplary load, speaker SPKR, through an LC filter comprising inductor L1 and capacitor C2. A coupling capacitor C1 isolates load SPKR from the DC value at the output terminal of converter integrated circuit. In response to an over-current being detected, transistors P1 and N1 are disabled, causing a current $I_L$ to flow from inductor L1, due to magnetic energy stored in inductor L1, as well as any energy stored in speaker SPKR. FIG. 1B shows the CMOS switching amplifier power output stage of FIG. 1A, fabricated on a substrate SUB. Transistor P1 is fabricated in an N-well WELL in P-substrate SUB and transistor N1 is formed directly in P-substrate SUB. Substrate SUB is biased to ground through a contact formed by P+ material and well WELL is biased to positive power supply rail $+V_D$ by a contact formed by N+ material.

Due to the fabricated CMOS structure, a parasitic NPN bipolar transistor PT2 is formed between the N+ source and drain terminals of transistor N1, the substrate SUB and the N-well WELL. A parasitic transistor PT1 is formed between the P+ source and drain terminals of transistor P1, the N-well WELL and the P-type substrate SUB. Resistor $R_{well}$ represents the resistance of the material of N-well WELL to positive power supply rail $+V_D$ and resistor $R_{sub}$ represents the resistance of the material of P-type substrate SUB to ground. Under normal operating conditions and due to the bias voltages applied to P-type substrate SUB and N-well WELL, the parasitic bipolar transistors, which are connected back-to-back in a circuit that also resembles an SCR, are in equilibrium. In their equilibrium state, parasitic transistors PT1 and PT2 are off, and the only current flowing through their collectors is a leakage current and the equilibrium state is ensured by the biasing of P-type substrate SUB and N-well WELL.

However, if sufficient disruption occurs in N-well WELL or P-type substrate SUB to cause one of parasitic transistors PT1 and PT2 to start to come on, the feedback connection from the collector of parasitic transistor PT2 to the base of parasitic transistor PT1 and the other feedback connection from the collector of parasitic transistor PT1 to the base of parasitic transistor PT2 will cause both parasitic transistors PT1 and PT2 to conduct, causing latch-up and circuit failure, as any conduction caused in the collector of either parasitic transistor PT1 or PT2 is multiplied by the product of their current gains. As long as the current gain product is greater than unity, the series connection of parasitic transistors PT1 and PT2 will stay saturated, effectively shorting positive power supply rail $+V_D$ to ground through the integrated circuit, causing latch-up failure.

A disturbance sufficient to cause latch-up can be caused by the discharge of stored magnetic energy in inductor L1 and/or speaker SPKR when transistors N1 and P1 are disabled. The current $I_L$ through inductor L1 cannot suddenly change. Therefore, when transistors N1 and P1 are disabled in response to a detected over-current condition, if the energy stored in inductor L1 is sufficiently high, parasitic transistor PT2 will turn on (due to the outward direction of current $I_L$) and cause minority carrier injection into the substrate. The activation of parasitic transistor PT2 causes conduction of parasitic transistor PT1, and conduction will directly occur across the power supply provided to transistors N1 and P1, causing failure of the output stage and possibly the power supply circuits. Even if the minority carrier injection is low enough that parasitic transistors PT1 and PT2 are not fully activated, the minority carrier injection into substrate SUB can disrupt other devices formed by N-type diffusions into substrate SUB, including wells that isolate P-channel transistors formed above substrate SUB.

Figure 2:
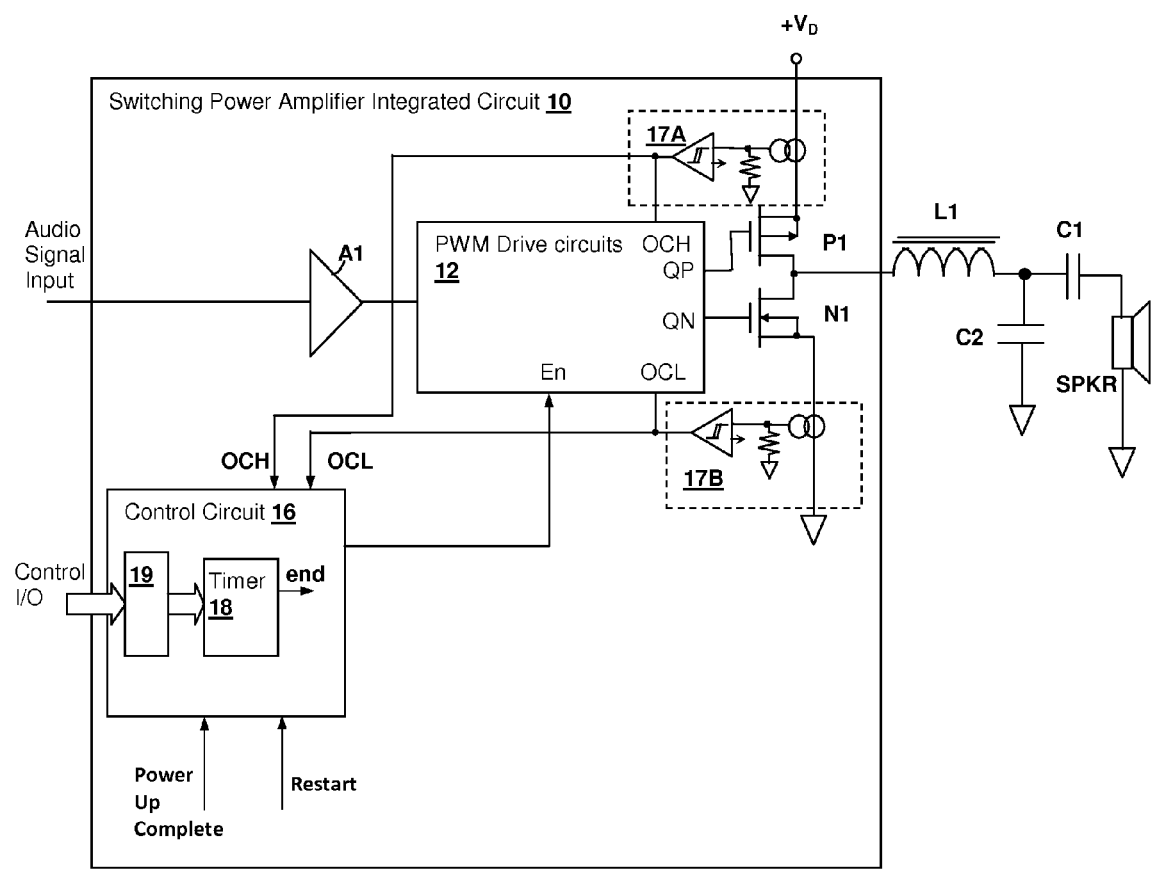
FIG. 2 is a schematic diagram depicting an integrated circuit in accordance with an embodiment of the present invention.

Referring now to FIG. 2, an audio switching power amplifier integrated circuit 10 is shown, in accordance with an embodiment of the present invention. In the depicted embodiment, transistors N1 and P1 are fabricated on the same substrate as control circuits and amplifier circuits that provide other operations within audio switching power amplifier integrated circuit 10. While the embodiments illustrated herein show half-bridge "push-pull" configurations, it is understood that the present invention applies equally to full-bridge configurations and that "push-push" (N-N or P-P) half or full-bridge configurations may also be employed. It is also understood that the applicability of the invention extends beyond CMOS circuits to other technology types, such as DMOS and Bipolar-CMOS-DMOS(BCD) technologies. The inductive energy discharging technique may be applied to each half of a full-bridge switch, prior to disabling all of the output devices, which ensures that a conduction path is provided on both sides of the full-bridge to discharge the stored magnetic energy. The output terminal is coupled to speaker SPKR through the LC filter comprising inductor L1 and capacitor C2 and is DC-isolated by capacitor C1. A pulse width modulator (PWM) drive circuit 12 provides the control (drive) signals that operate transistor P1 and N1 to provide a bi-polar pulsed output at the output terminal of converter integrated circuit 10 that is connected to inductor L1. The filter provided by inductor L1 and capacitor C2 smooth the pulsed signal into the desired AC waveform, which is an amplified replica of the AC input signal being amplified by an amplifier A1 from an input signal audio signal input provided at an input to converter integrated circuit 10. An enable input signal is provided to PWM drive circuits 12 from control circuit 16 to enable pulsing from PWM drive circuits 12, thereby disabling transistors N1 and P1 when the enable signal is deactivated. Control circuit 16 is a state machine that includes a timer 18 to time a predetermined period of time corresponding to the discharge period for discharging the stored magnetic energy in the inductive load. Enable signal en is disabled at power-up of integrated circuit 10 and is asserted after an indication by signal Power up complete that initialization is complete, to commence normal switching operation of transistors N1 and P1 to generate an audio output. Enable signal en is asserted during both normal switching operation of integrated circuit 10 and during the energy discharge cycle that is commenced in response to an over-current condition indication. Enable signal en is disabled in response to an end output of timer 18 after completion of the energy discharge cycle, which causes PWM drive circuits 12 to disable transistors N1 and P1 after stored inductive energy has been discharged from the load.

A pair of over-current detectors 17A-17B provide indications (signals OCH and OCL) of over-current conditions through transistors P1 and N1, respectively. Both of signals OCH and OCL may be treated as shutdown signals that disable switching power amplifier integrated circuit 10 completely until a reset indication is received or the power supply voltage is removed and reapplied. Alternatively, audio switching power amplifier integrated circuit 10 may disable the output stage transistors N1 and P1 in response to either of over-current signals OCH and OCL and then permit re-enabling output stage transistors N1 and P1 once over-current signals OCH and OCL indicate that the over-current condition has been removed.

When one of over-current signals OCH and OCL is asserted during normal switching operation of the output stage, there may be a large amount of energy stored in inductor L1 and/or speaker SPKR. Therefore, in order to prevent latch-up, it is desirable to remove the stored energy before disabling both of transistors P1 and N1. Over-current signals OCH and OCL therefore trigger control circuit 16 to activate a timer 18 that times a predetermined period after an over-current is detected during normal switching operation of the output stage. Since the over-current level (and thus the current through inductor L1) is known at the time of detection of the over-current condition, as being equal to the over-current detection threshold, the predetermined time period is set to be just sufficient to discharge inductor L1 and any other load inductance from that threshold current level. The predetermined time period can therefore be set, via control port 19, to correspond to the load inductance present in the application. A restart signal Restart is provided to control circuit 16, which causes control circuit 16 to enable PWM drive circuits 12 to restart normal operation of integrated circuit 10 after an over-current shutdown sequence. Restart signal Restart may be derived from one or multiple sources, such as a reset input, a signal that indicates power has been cycled to integrated circuit 10, and/or over-current indications OCH and OCL being in a de-asserted state for a specified time after an over-current shutdown has been performed.

When an over-current condition is detected, the output transistor (one of transistor N1 or P1) that has a conduction direction corresponding to the over-current condition is turned off, and the other transistor is turned on to provide an energy-discharging period of the output stage control, during which a conductive path is provided to discharge the energy stored in the inductive load. PWM drive circuits 12 receive over-current signals OCH and OCL, and in response to one of over-current signals OCH and OCL being asserted, forces the transistor having the conduction direction matching the over-current condition to the OFF state, and the other transistor to the ON state until timer 18 within control circuit 16 de-asserts the enable input En at PWM drive circuit 12 by generating an end signal /end that indicates the end of the predetermined time period. In the depicted embodiment, if over-current signal OCH is asserted, then output QP is set to its higher-voltage state so that transistor P1 is disabled, and output QN is also set to the higher-voltage state, so that transistor N1 is enabled to discharge the stored magnetic energy during a discharge period. The discharge period continues until enable input En is de-asserted by timer 18, which causes output QN to be set to the lower-voltage state, disabling transistor N1. Similarly, if current signal OCL is asserted, then output QN is set to its lower-voltage state so that transistor N1 is disabled, and output QP is also set to the lower-voltage state, so that transistor P1 is disabled, until enable input En is de-asserted by timer 18, which causes output QP to be set to the higher-voltage state, disabling transistor P1.

Figure 3:
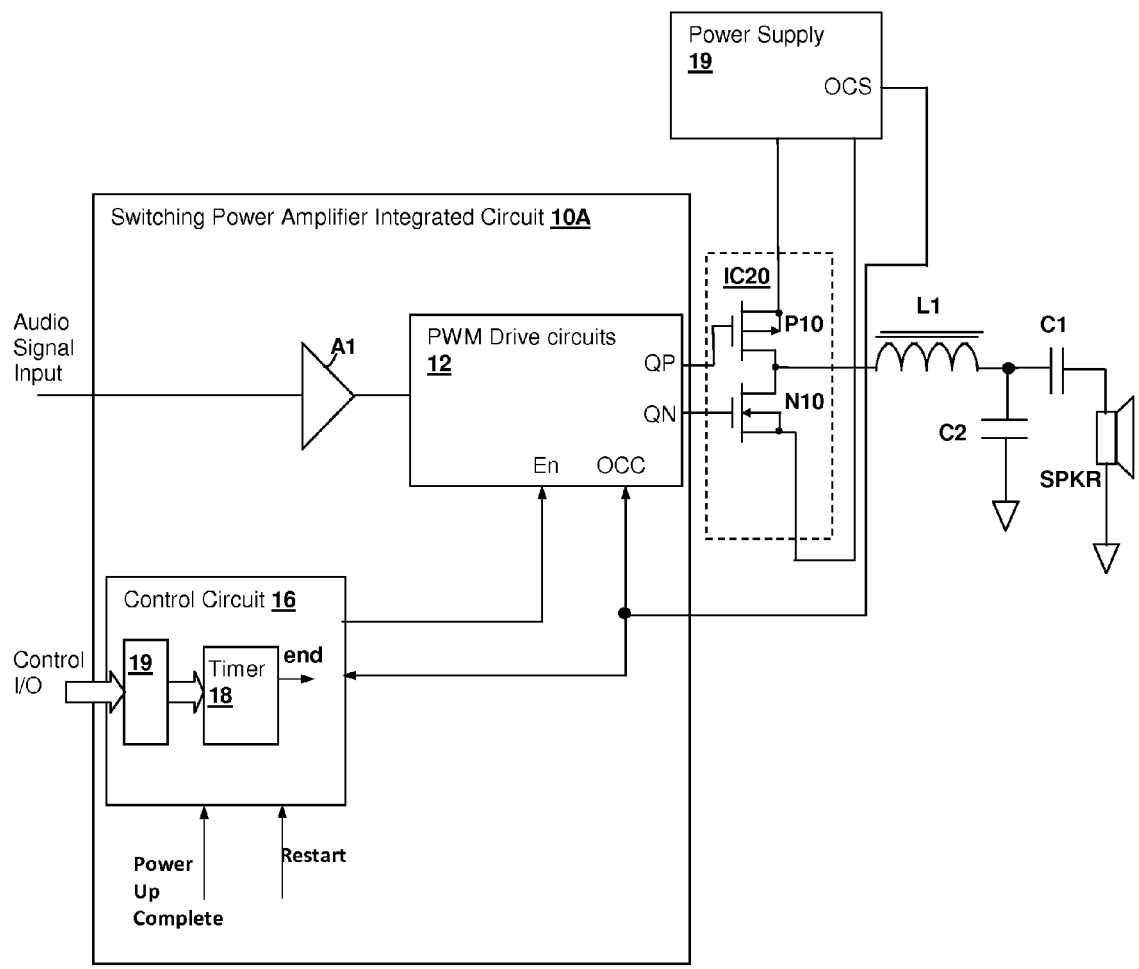
FIG. 3 is a schematic diagram depicting an integrated circuit in accordance with another embodiment of the present invention.

Referring now to FIG. 3, a switching audio power amplifier integrated circuit 10A, in accordance with another embodiment of the invention is depicted. The circuit of FIG. 3 is similar to that of FIG. 2, and therefore only differences between them will be described below. There are two primary differences between switching audio power amplifier integrated circuit 10A of FIG. 3 and switching audio power amplifier integrated circuit 10 of FIG. 2. The first difference is that switching audio power amplifier integrated circuit 10A provides drive signals to an external set of power switching transistors N10 and P10, which may be supplied in a monolithic integrated circuit IC20 as shown. If power switching transistors N10 and P10 are fabricated on the same substrate, then the above-described latch-up problem still applies to their operation.

The second difference illustrated in FIG. 3 is that the over-current condition is provided as an overload output OCS from a power supply 19 that provides power to the power output stage formed by power switching transistors P10 and N10. Overload output OCS provides the over-current condition signal OCC to switching audio power amplifier integrated circuit 10A. Such an output may be provided with no indication as to the polarity of an over-current condition. Therefore, rather than determining which transistor to enable and which to disable during the energy discharging period directly from the over-current detection, the state of the control circuits that provide the QP and QN outputs of PWM drive circuits 12 is sampled internally at the time the over-current condition signal OCS is asserted. However, to avoid improper triggering due to overshoot or noise, it is desirable to track the states of control signals providing the QP and QN outputs of PWM drive circuits 12 or the audio input, to determine the true polarity of the current flowing through inductor L1. Control circuit 16 also receives overload output signal OCS, which activates timer 18.

Figure 4:
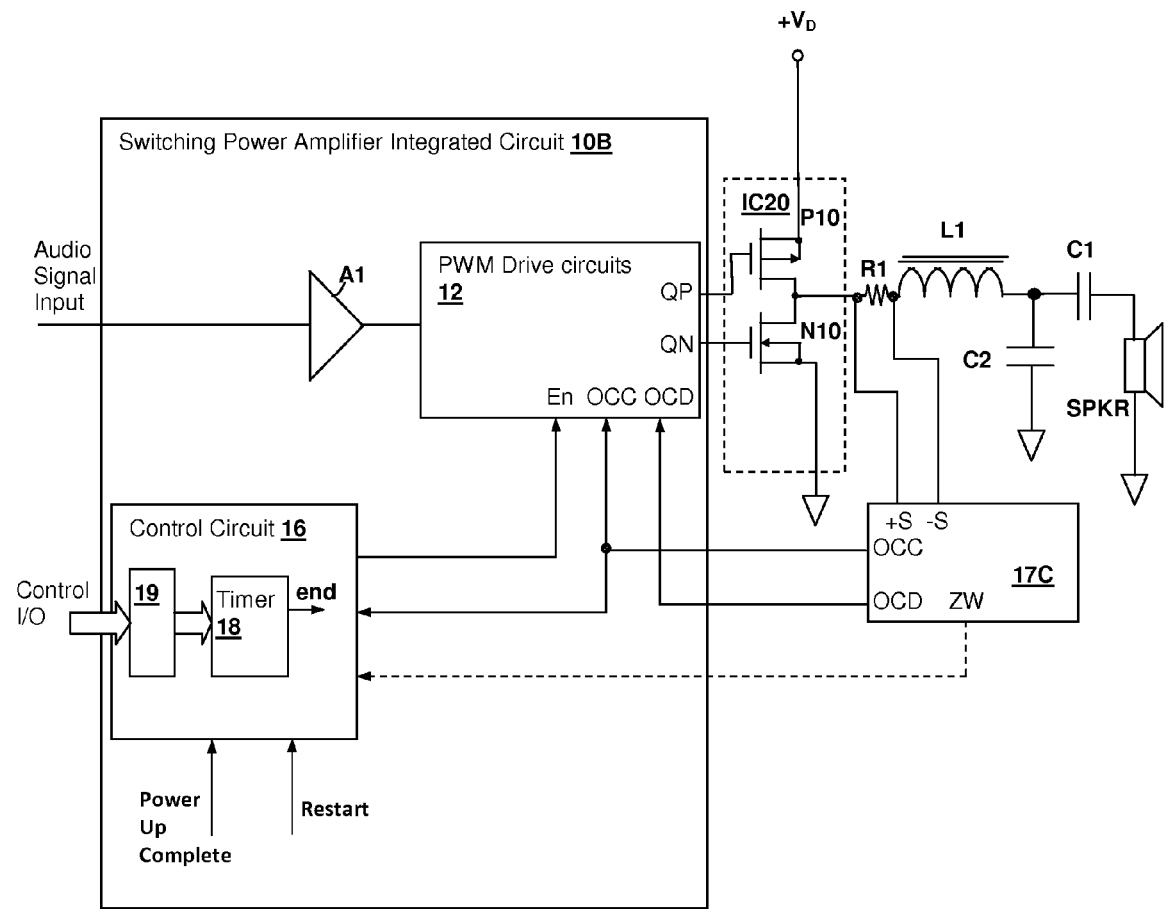
FIG. 4 is a schematic diagram depicting an integrated circuit in accordance with yet another embodiment of the present invention.

Referring now to FIG. 4, a switching audio power amplifier integrated circuit 10B, in accordance with another embodiment of the invention is depicted. The circuit of FIG. 4 is similar to that of FIG. 3, and therefore only differences between them will be described below. In the circuit of FIG. 4, an over-current condition is detected by directly measuring the current of the output provided from switching power transistors P10 and N10 via sense resistor R1, which is coupled to sense inputs S− and S+ of over-current detector 17C. Over-current detector 17C provides over-current condition indicating output signal OCC, along with an over-current direction (polarity-indicating) signal OCD. PWM drive circuits 12 determine which output QP or QN to activate, and which to disable, in conformity with the stage of over-current direction signal OCD at the time when over-current condition signal OCC is asserted, which provides a direct indication of the direction of the current flowing through inductor L1. While the above embodiments of FIGS. 2-4 illustrate various techniques for detecting over-current conditions and determining the transistor having a conduction direction corresponding to the over-current condition, it is understood that there are other techniques for detecting over-current conditions which may be applied to the invention and other techniques for determining which transistor should be immediately disabled and which should be temporarily enabled to discharge the stored magnetic energy. For example, the circuit of FIG. 4 could use the internal state controlling output signals QP and QN (or their actual states) to determine the over-current direction, and the OCD signal output of over-current detector 17C would not be required.

As an alternative to timing a predetermined time period, if the current through inductor L1 is sensed, any of the above-described embodiments may be modified to provide control circuit 16 with a signal indicating that the current through inductor L1 has fallen below a threshold. Timer 18 may then be omitted, and signal end generated directly from the indication that the current through inductor L1 has fallen at least to the point where it is safe to de-assert enable signal en. As illustrated in FIG. 4, over-current detector 17C may also provide a zero current window signal ZW that indicates when the current through sense resistor R1 is within a predetermined window around zero current level. When zero current window signal ZW is asserted, control circuit 16 de-asserts signal en, effectively using zero current window signal ZW in the place of signal end provided from timer 18. Thus, in the alternative embodiment, timer 18 is not needed to end the discharging period.

Figure 5:
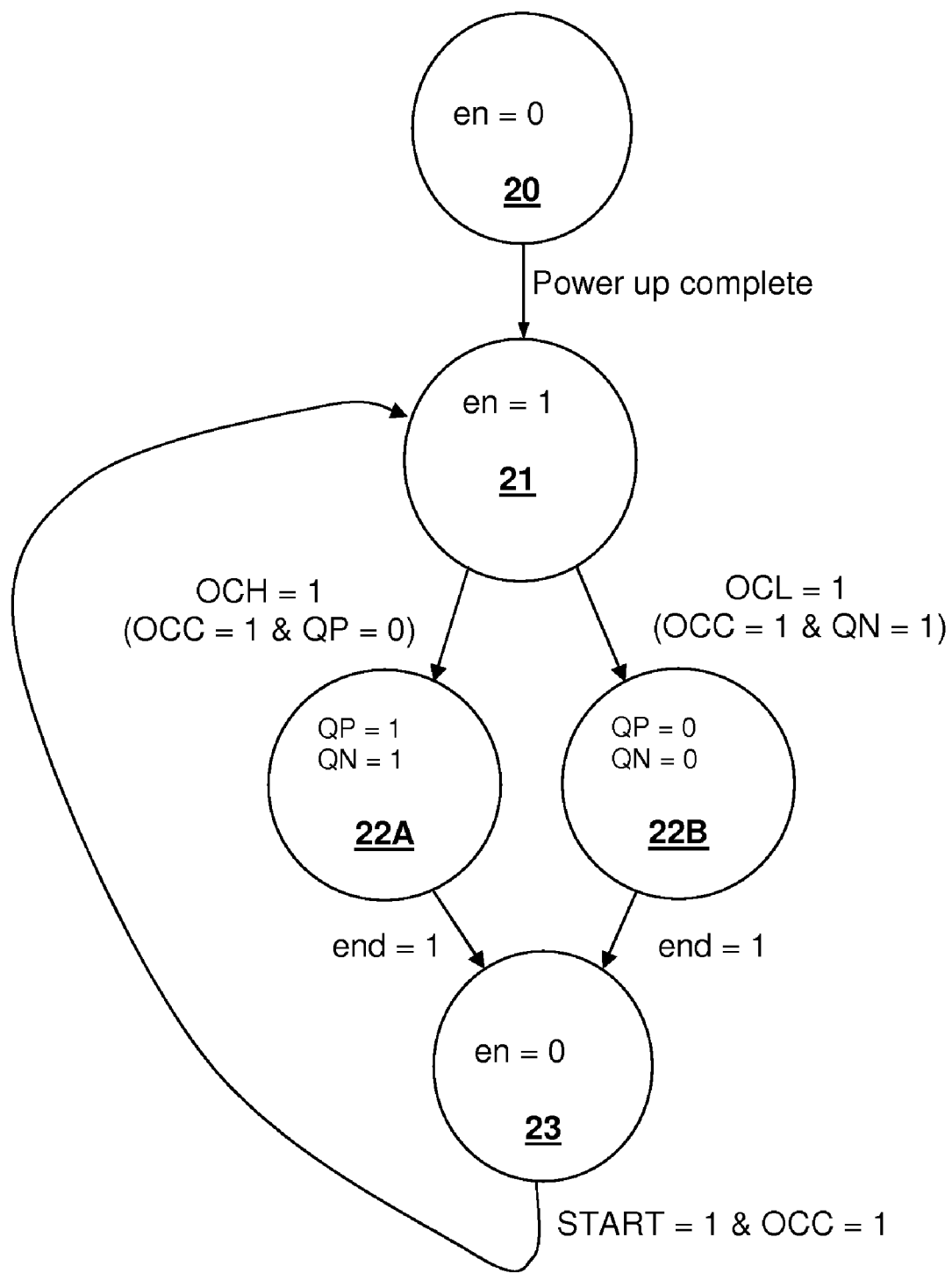
FIG. 5 is a state diagram depicting operation of control circuit 16 within the integrated circuits depicted in FIGS. 2-4.

Referring now to FIG. 5, a state diagram is shown that illustrates operation of control circuit 16 and PWM control drive 12 within above-described circuits of FIG. 2 through FIG. 4. At power-up, the state of control circuit 16 begins in a high-impedance state 20 and signal en is de-asserted, and at completion of the power-up sequence, control circuit 16 transitions to state 21, which is the normal switching state of the output stage, during which signal en is asserted and during which energy may be stored in the load inductance(s). Control circuit 16 will remain in state 21 until over-current condition signal OCH or OCL is asserted, or power is cycled, commencing another power-up sequence. When over-current condition signal OCH or OCL is asserted, control circuit 16 and PWM drive circuit 12 transition either to state 22A, if over-current indication OCH (FIG. 2) is asserted or drive signal QP is in its low-voltage state and over-current condition signal OCC is set (FIGS. 3-4), or to state 22B, if over-current indication OCL (FIG. 2) is asserted or drive signal QN is in its high-voltage state and over-current condition signal OCC is set (FIGS. 3-4). State 22A and state 22B are the energy reducing states of the output stage and correspond to two different energy reducing state, the selection of which is dependent on the over-current direction, which is determined by the conditions for entry to state 22A or 22B. In state 22A, output drive signals QP and QN are set to a high-voltage state, disabling transistor QP, which is the transistor corresponding to the determined over-current direction, and enabling transistor QN to discharge the energy stored in the inductive load. Similarly, in state 22B, output drive signals QP and QN are set to a low-voltage state, disabling transistor QN, which is the transistor corresponding to the determined over-current direction, and enabling transistor QP to discharge the energy stored in the inductive load. States 22A and 22B effectively invert the states of output drive signals QP and QN with respect to the states of output drive signals QP and QN when the over-current condition was detected. Control circuit 16 and PWM drive circuit 12 remain in energy reducing states 22A or 22B until the end signal output of timer 18 indicates that the predetermined time period has elapsed (end=1), or alternatively zero-current window signal ZW indicates that the current through inductor L1 has fallen sufficiently low (end=1). Control circuit 16 then transitions to state 23 until signal Restart is asserted, and resumes normal operation in state 21, unless one of over-current condition signals OCH or OCL is still asserted.

Figure 6:
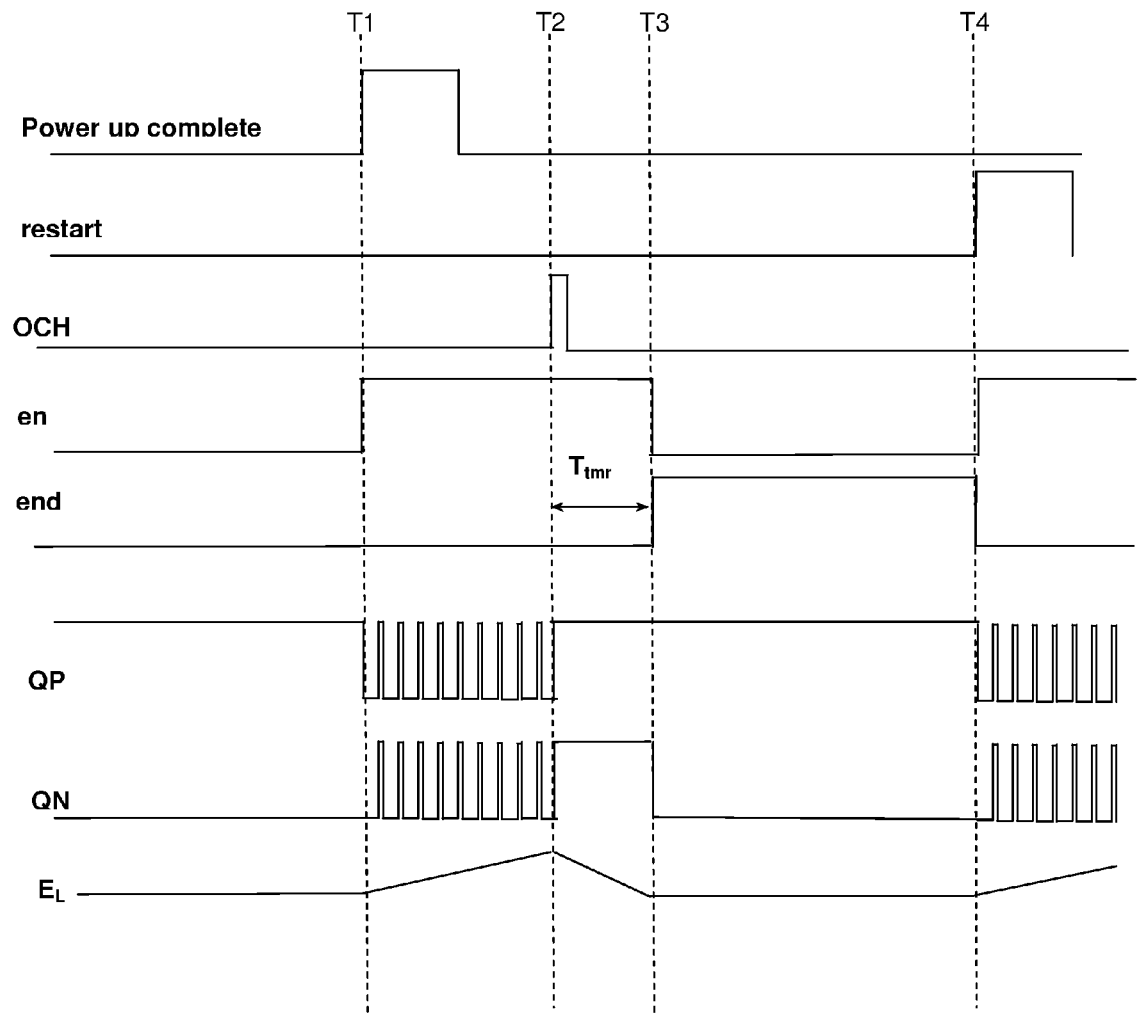
FIG. 6 is a signal waveform diagram depicting signals within the circuits depicted in FIGS. 2-4.

Referring now to FIG. 6, a signal diagram is shown that illustrates operation of the above-described circuits. The left side of FIG. 6 illustrates assertion of signal Power up complete, and the de-assertion of the enable signal en until the power-up initialization sequence is finished. PWM output signals QP and QN are not changing and are set to disable the power switching output transistors. After signal Power up complete is asserted at time T1, the switching power amplifier operates, and generates in the example, an output voltage having a substantially positive value, since output signal QP has an on-time greater than the corresponding off-time, and vice versa for output signal QN. When over-current condition signal OCH is asserted at time T2, output signals QP and QN are set to the state opposite to their states at time T2 when the over-current condition was detected, and are maintained in the new state for a predetermined period $T_{tmr}$, or alternatively until zero-current window signal ZW indicates that the current through inductor L1 has fallen sufficiently low to avoid latch-up. Inductor energy $E_L$ is shown for reference and illustrates a complete discharge of the stored magnetic energy during the predetermined period $T_{tmr}$, although it is not a requirement that $T_{tmr}$ be long enough to completely discharge the stored magnetic energy under all conditions. It may be sufficient in some applications to only reduce the stored magnetic energy to a level at which damage to the integrated circuit will be prevented. At time T3, which is the end of predetermined period $T_{tmr}$, enable signal en is de-asserted and signal QN is then set to disable the N-channel driver transistor (N1 or N10 in the exemplary embodiment). At time T4, signal Restart is asserted and normal switching operation resumes.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A method for protecting circuits within an integrated circuit having an audio amplifier switching driver stage and coupled to an inductive load by power switching devices, the method comprising:
   receiving an over-current indication that indicates the output of the integrated circuit should be shut down due to an over-current condition;
   responsive to receiving the over-current signal, first disabling a first one of the power switching devices that has a conduction direction corresponding to the over-current condition;
   responsive to receiving the over-current signal, enabling a second one of the power switching devices that has a conduction direction opposite to the conduction direction of the first power switching device; and
   subsequent to discharging energy from said inductive load, second disabling the second power switching device, whereby an output of the audio amplifier is not completely disabled until the energy stored in the inductive load is reduced through the second power switching device.

2. The method of claim 1, further comprising responsive to receiving the over-current signal, activating a timing circuit having a predetermined expiration period, and wherein said second disabling is performed responsive to expiration of the predetermined expiration period.

3. The method of claim 1, further comprising determining that a magnitude of a current flowing through the inductive load is less than a predetermined threshold, and wherein said second disabling is performed responsive to determining that the magnitude of the current flowing through the inductive load is less than the predetermined threshold.

4. The method of claim 1, further comprising determining which of the power switching devices has a conduction direction corresponding to the over-current condition, and wherein the first disabling and the enabling are performed in conformity with a result of the determining.

5. The method of claim 4, wherein the determining determines which of the power switching devices has a conduction direction corresponding to the over-current condition by comparing outputs of two over-current detectors, one for each of the conduction directions of the power switching devices.

6. The method of claim 4, wherein the determining determines which of the power switching devices has a conduction direction corresponding to the over-current condition by sampling a control state that controls the audio amplifier switching driver stage at a time corresponding to when the over-current indication is received.

7. The method of claim 4, wherein the determining determines which of the power switching devices has a conduction direction corresponding to the over-current condition by measuring the polarity of the current delivered from the power switching devices to the inductive load at a time corresponding to when the over-current indication is received.

8. The method of claim 1, further comprising providing outputs of the audio amplifier switching driver stage at external terminals of the integrated circuit to control external power switching devices, wherein the first and second disabling and the enabling are performed by setting states of the outputs of the audio amplifier switching driver stage to disable the external power switching devices.

9. The method of claim 1, wherein the audio amplifier switching driver stage is a power driver stage, and wherein the first and second disabling disable power switching devices of the power driver stage that are internal to the integrated circuit package, and wherein the enabling enables a power switching device of the power driver stage that is internal to the integrated circuit package.

10. The method of claim 1, further comprising detecting the over-current condition internal to the integrated circuit, whereby the receiving receives a result of the detecting as an over-current signal internal to the integrated circuit.

11. The method of claim 1, further comprising detecting the over-current condition external to the integrated circuit, whereby the receiving receives a result of the detecting as an over-current signal provided to an over-current terminal of the integrated circuit.

12. The method of claim 10, wherein the detecting further detects the polarity of the over-current condition and provides an indication of the polarity to the integrated circuit.

13. An integrated circuit, comprising:
   an audio amplifier switching driver stage having an output connected to the output terminal and controlled by an audio signal;
   at least one output terminal for coupling the audio amplifier switching driver stage to an inductive load; and
   a control circuit responsive to an over-current indication for disabling an audio amplifier switching power stage, wherein the control circuit disables a first switching device of the switching power stage having a conduction direction corresponding to the over-current condition and enables a second switching device of the switching power stage having a conduction direction opposite to the conduction direction of the first switching device in response to the over-current indication to reduce energy stored in the inductive load, and wherein the control circuit disables the second switching device after discharging energy from the inductive load, whereby the switching power stage is not completely disabled until the energy stored in the inductive load is reduced.

14. The integrated circuit of claim 13, wherein the control circuit comprises a timing circuit that is activated in response to the over-current indication to time a predetermined time period, and wherein the control circuit disables the second switching device in response to expiration of the predetermined time period.

15. The integrated circuit of claim 13, wherein the control circuit comprises a detector for detecting that the magnitude of a current flowing through the inductive load is less than a predetermined threshold, and wherein the control circuit disables the second switching device in response to an output of the detector.

16. The integrated circuit of claim 13, further comprising a pair of over-current detectors, each coupled to a corresponding one of the first and second switching devices of the switching power stage, wherein the over-current detectors have over-current outputs coupled to the control circuit, and wherein the control circuit determines which of the first and second switching devices has a conduction direction corresponding to the over-current condition from the states of the over-current outputs of the over-current detectors.

17. The integrated circuit of claim 13, wherein the control circuit determines which of the first and second switching devices has a conduction direction corresponding to the over-current condition from the state of control logic that controls the audio amplifier switching driver stage at a time corresponding to when the over-current indication is received.

18. The integrated circuit of claim 13, wherein the control circuit determines which of the first and second switching devices has a conduction direction corresponding to the over-current condition by measuring the polarity of the current delivered from the switching power stage to the inductive load at a time corresponding to when the over-current indication is received.

19. The integrated circuit of claim 13, wherein the audio amplifier switching power stage comprises external power switching devices, wherein the at least one output terminal comprises a pair of terminals for controlling the external power switching devices, and wherein the control circuit enables and disables the external power switching devices by setting states of the outputs of the audio amplifier switching driver stage to disable the external power switching devices.

20. The integrated circuit of claim 19, further comprising an over-current condition terminal for receiving the over-current indication from an external over-current detector coupled to at least one of the external power switching devices.

21. The integrated circuit of claim 20, further comprising an over-current direction terminal for receiving an indication of polarity of the over-current condition, and wherein the control circuit determines which of the first and second switching devices has a conduction direction corresponding to the over-current condition from the indication of polarity.

22. The integrated circuit of claim 13, further comprising internal power switching devices providing the audio amplifier switching power stage, and wherein the at least one output terminal comprises a terminal for connection directly to the inductive load.

23. An integrated circuit including a protection circuit for protecting switching power amplifier circuits from latch-up and other failures due to energy returned from an inductive load when one or more transistors in an amplifier switching power output stage are disabled in response to an over-current condition, wherein the protection circuit detects an over-current condition and disables a transistor corresponding to the over-current conduction and enables another transistor corresponding to the conduction direction opposite the over-current direction so that energy stored in inductance of the load is reduced, preventing back-currents that would otherwise may cause latch-up and consequent destruction of the integrated circuit when the amplifier switching power output stage is disabled.

24. The integrated circuit of claim 23, wherein after a predetermined time period has elapsed after the over-current condition is detected, the entire amplifier switching power output stage is disabled.

25. The integrated circuit of claim 23, wherein the protection circuit further comprises a detector for detecting when a magnitude of a current flowing through the inductive load is less than a predetermined threshold, and wherein when the magnitude of the current flowing through the inductive load falls below the predetermined threshold, the entire amplifier switching power output stage is disabled.

* * * * *